(12) United States Patent
Polhemus

(10) Patent No.: US 9,831,773 B2
(45) Date of Patent: Nov. 28, 2017

(54) CURRENT SENSING IN A POWER SUPPLY

(71) Applicant: Infineon Technologies Americas Corp., El Segundo, CA (US)

(72) Inventor: Gary D. Polhemus, Sebago, ME (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 14/974,423

(22) Filed: Dec. 18, 2015

(65) Prior Publication Data

US 2017/0179824 A1    Jun. 22, 2017

(51) Int. Cl.
  *H02M 3/158*     (2006.01)
  *H02M 1/32*      (2007.01)
  *H02M 1/00*      (2006.01)

(52) U.S. Cl.
  CPC ............. *H02M 3/158* (2013.01); *H02M 1/32* (2013.01); *H02M 2001/0009* (2013.01)

(58) Field of Classification Search
  CPC ............. H02M 3/1584; H02M 3/1588; H02M 3/156–3/158; H02M 3/3378; H02M 1/32; G05F 1/56; G05F 1/573; G05F 1/575; H02H 1/0015
  USPC ............. 323/271, 273, 276; 361/18, 42, 60; 363/26
  See application file for complete search history.

(56) References Cited

U.S. PATENT DOCUMENTS

| | | | |
|---|---|---|---|
| 6,204,787 B1* | 3/2001 | Baird | H03M 3/488 341/139 |
| 8,111,017 B2* | 2/2012 | Lin | H05B 33/0845 315/209 R |
| 2014/0266103 A1* | 9/2014 | Wang | G05F 1/462 323/274 |
| 2016/0036326 A1* | 2/2016 | Sreenivas | H02M 3/158 323/271 |

\* cited by examiner

*Primary Examiner* — Yemane Mehari
(74) *Attorney, Agent, or Firm* — Chapin IP Law, LLC

(57) ABSTRACT

During operation, a protection circuit receives an input voltage representative of current delivered by a power supply phase to a load. In one configuration, the input voltage is received as the voltage across respective drain-source nodes of a synchronous switch (low side switch) disposed in a power supply. The protection circuit selectively controls conveyance of the input voltage so that damaging transient voltages on the input voltage are not passed to a downstream sampling circuit. The sampling circuit includes a capacitor circuit to store the sample of the input voltage. During operation, the sampling circuit utilizes the input voltage conveyed by the input voltage circuit to charge the capacitor with a sample voltage representative of the current. Because the sampling circuit is protected from the damaging transient voltages via the protection circuit, the sampling circuit as well as other downstream circuitry can be fabricated from a type of transistors other than those used in the input voltage circuit to facilitate more accurate current calculations using a small sized capacitor to store the sample of the input voltage.

35 Claims, 10 Drawing Sheets

CURRENT SENSING IN A POWER SUPPLY

BACKGROUND

Conventional switching power supplies often include a way to monitor an amount of current delivered to a respective load. The amount of delivered current can be monitored for any number of reasons such as telemetry, load-line control, current consumption tracking, to increase conversion efficiency, etc.

Several methods have been used to measure current delivered by a respective power supply to a load. For example, Hall effect sensors can be implemented to measure magnetic field and calculate a respective current. Unfortunately, Hall effect sensors are expensive and cannot be integrated into respective semiconductor device.

Other conventional designs include adding a respective resistor in a current source path of the power supply. A voltage monitor circuit measures current passing through the added resistor to identify how much current is delivered to a respective load. This method is undesirable because the added resistor consumes power that does not power the load.

Another method is known as DCR (DC Resistance). This method includes utilizing the resistance of a respective inductor through which current flows to calculate the amount of current delivered to a respective load. This method is undesirable because it cannot be integrated in a semiconductor device; it requires trimming of a respective gain circuit; it requires temperature compensation, etc.

Additional methods include current mirroring techniques and measuring the voltage across a respective synchronous field effect transistor in a power supply. Both of these methods are undesirable. For example, current mirroring requires complex circuitry and high-bandwidth amplifier circuitry. The conventional method of measuring the voltage across a respective drain-source of a synchronous field effect transistor requires a complex and highly robust circuit because the voltage at switch node (junction node of control switch, synchronous switch, and inductor) is susceptible to transient voltages through a switching cycle.

BRIEF DESCRIPTION

Embodiments herein include novel circuitry operable to calculate an output current of a power supply circuitry. In one embodiment, the novel circuitry is compact with respect to conventional current sensing circuits and provides a more accurate way to measure current supplied by a power supply phase to a load using low voltage transistors. All or a portion of the circuitry as described herein can be implemented in any suitable manner such as in a semiconductor device such as a chip.

More specifically, one embodiment herein includes a current monitor circuit. The current monitor circuit includes an input voltage circuit (such as a protection circuit) and a sampling circuit. During operation, the input voltage circuit receives an input voltage representative of current delivered by a power supply to a load. In one embodiment, the input voltage is a voltage across corresponding drain and source nodes of a synchronous switch (low side switch) disposed in a switching power supply. The received input voltage may include voltage spikes. The input voltage circuit controls conveyance of the input voltage so that damaging transient voltages in the input voltage are not passed to the sampling circuit.

The sampling circuit utilizes the input voltage received from the input voltage circuit to produce and store a sample input voltage value representative of the current delivered to the load. Further circuitry in the power supply converts the stored sample voltage into a value representative of the current supplied to the load.

In one embodiment, the input voltage circuit is a protection circuit preventing transient voltages on the input voltage (above a positive threshold value and below a negative threshold value) from being conveyed to the sampling circuit. The input voltage circuit can be fabricated from a first set of one or more types transistor devices that can withstand exposure to higher voltage spikes present on the input voltage. The sampling circuitry is fabricated from a second set of one or more types of transistor devices that have a lower tolerance to the voltage spikes, but which enable use of a small sampling capacitor circuit to store a sample voltage.

In accordance with yet further embodiments, the sampling circuit includes a sampling switch operable to selectively couple the input voltage circuit to capacitor circuitry in the sampling circuit. This stores a sample of the input voltage. For example, activation of the sampling switch electrically couples the input voltage received from the input voltage circuit to the capacitor circuitry in the sampling circuit.

The input voltage circuit can be configured to control conveyance of the input voltage and provide protection to the sampling circuit in any suitable manner. For example, in one embodiment, the input voltage circuit includes multiple switches to controllably convey the input voltage to the sampling circuit. The multiple switches can be configured to provide a series connection of a first switch (such as one that blocks positive voltage transients) and a second switch (such as one that blocks negative voltage transients) through which the input voltage is controllably conveyed to the sampling circuit. Simultaneous activation of the multiple series switches in the appropriate time window (such as when there are no voltage spikes on the input voltage) provides a low impedance path (such as less than 100 ohms) on which to convey the input voltage through the input voltage circuit to the sampling circuit. Further, in one embodiment, simultaneous deactivation of the multiple series switches outside of the window produces a high impedance path, preventing the transient voltages on the input voltage from being conveyed to the sampling circuit and causing damage.

As previously discussed, the input voltage circuit (protection circuit) can be configured to include switch control circuitry operable to simultaneously activate the first switch circuitry and the second switch circuitry during a window in which a magnitude of the input voltage is within an operating range that will not cause damage to the sampling circuit. In such an instance, the input voltage circuit is operable to prevent conveyance of the input voltage to the sampling circuit during a first condition in which a magnitude of the input voltage is greater than or potentially greater than a first threshold value; the input voltage circuit is further operable to convey the input voltage to the sampling circuit during a second condition in which a magnitude of the input voltage is within a safe operational range that will not cause damage to the sampling circuit.

In accordance with further embodiments, as previously discussed, the input voltage circuit conveys the received input voltage to a sampling switch in the sampling circuit during a window of time when it is known or it is likely that transients are not present in the input voltage as mentioned above. The sampling circuit can be configured to include capacitor circuitry. A control signal activates the sampling switch in the window of time to electrically couple the received input voltage to the capacitor circuitry. In this manner, activation of a switch in the sampling circuit stores a voltage value indicative of the amount of current delivered by a power supply to a respective load.

Further embodiments herein include a charge amplifier as well as corresponding downstream processing circuitry to convert the stored voltage value (sample of the input voltage) into a calculated value indicative of the amount of current delivered by the power supply to the load. For example, one embodiment includes operating a charge amplifier circuit to amplify the stored sample voltage representative of the current.

As previously discussed, the stored sample of the input voltage can be a voltage across a drain node and source node of a field effect transistor through which the current is sourced to the load. A respective RDSON value of the field effect transistor represents a resistance value of field effect transistor through which the current passes. Downstream from the charge amplifier, the processing circuitry utilizes an $RDS_{ON}$ value of the field effect transistor and the amplified stored sample voltage to derive a calculated current value indicative of the current delivered by the power supply to the load.

These and other more specific embodiments are disclosed in more detail below.

The embodiments as described herein are advantageous over conventional current measurement techniques. For example, as previously discussed, embodiments herein include an input voltage circuit to protect downstream circuit (such as sample and hold circuitry, charge amplifier circuit, etc.) from damage. In one embodiment, the downstream circuit is fabricated from a type of semiconductor devices such that the circuit produces a highly accurate calculated current value and affords the ability to use one or more small capacitors in which to store the input voltage samples from the input voltage during the window of time.

Note that embodiments as discussed herein are applicable to measuring current in DC-DC converters, voltage regulators with a buck topology, boost regulators, buck-boost regulators, etc. The concepts disclosed herein, are applicable to other suitable non-power supply circuitry in which it is desirable to know or calculate an amount of current delivered by a respective phase to a load.

Note that embodiments herein can include a circuit configuration of one or more processor devices to carry out and/or support any or all of the method operations disclosed herein. In other words, one or more computerized devices or processors can be programmed and/or configured to operate as explained herein to carry out different embodiments of the invention.

Yet other embodiments herein include software programs to perform the steps and operations summarized above and disclosed in detail below. One such embodiment comprises a computer program product that has non-transitory computer-storage media (e.g., memory, disk, flash, . . . ) including computer program logic encoded thereon that, when performed in a computerized device having a processor and corresponding memory, programs the processor to perform the operations disclosed herein. Such arrangements are typically provided as software, code and/or other data (e.g., data structures) arranged or encoded on a computer readable storage medium or non-transitory computer readable media such as an optical medium (e.g., CD-ROM), floppy or hard disk or other a medium such as firmware or microcode in one or more ROM or RAM or PROM chips, an Application Specific Integrated Circuit (ASIC), etc. The software or firmware or other such configurations can be installed onto a controller to cause the controller to perform the techniques explained herein.

Accordingly, one particular embodiment of the present disclosure is directed to a computer program product that includes a computer readable medium having instructions stored thereon for monitoring a voltage and/or calculating current. For example, in one embodiment, the instructions, when carried out by a computer processor hardware, causes the computer processor hardware in a controller resource to: receive an input voltage representative of current delivered by a power supply to a load; control conveyance of the received input voltage to a sampling circuit, the controlled conveyance protecting the sampling circuit from damage; and utilize the conveyed input voltage to store a sample voltage in the sampling circuit, the sample voltage representative of the current delivered by the power supply to the load.

The ordering of the steps has been added for clarity sake. These steps can be performed in any suitable order.

It is to be understood that the system, method, device, apparatus, etc., as discussed herein can be embodied strictly as hardware, as a hybrid of software and hardware, or as software alone such as within a processor, or within an operating system or within a software application.

Note that although each of the different features, techniques, configurations, etc., herein may be discussed in different places of this disclosure, it is intended, where appropriate, that each of the concepts can optionally be executed independently of each other or in combination with each other. Accordingly, the one or more present inventions as described herein can be embodied and viewed in many different ways.

Also, note that this preliminary discussion of embodiments herein purposefully does not specify every embodiment and/or incrementally novel aspect of the present disclosure or claimed invention(s). Instead, this brief description only presents general embodiments and corresponding points of novelty over conventional techniques. For additional details and/or possible perspectives (permutations) of the invention(s), the reader is directed to the Detailed Description section and corresponding figures of the present disclosure as further discussed below.

BRIEF DESCRIPTION OF THE DRAWINGS

The foregoing and other objects, features, and advantages of the invention will be apparent from the following more particular description of preferred embodiments herein, as illustrated in the accompanying drawings in which like reference characters refer to the same parts throughout the different views. The drawings are not necessarily to scale, with emphasis instead being placed upon illustrating the embodiments, principles, concepts, etc.

DETAILED DESCRIPTION

In accordance with one embodiment, a monitor circuit includes an input voltage circuit (protection circuit) and a downstream sample and hold circuit. During operation, the input voltage circuit receives an input voltage representative of current delivered by a power supply phase to a load. In one configuration, the input voltage is received as the voltage across respective drain-source nodes of a synchronous switch (low side switch) disposed in a power supply. The input voltage circuit selectively controls conveyance of the input voltage so that damaging transient voltages on the input voltage are not passed to the downstream sampling circuit. The sampling circuit includes a capacitor circuit to store a sample of the input voltage representative of the current delivered to the load.

Subsequent to sampling the input voltage at the appropriate time, such as in a window, a processing circuit utilizes the sampled input voltage to produce an estimate or value of the amount of current delivered to the load. The input voltage circuit is fabricated from one or more different types of transistors capable of withstanding voltage spikes on the received input voltage. Because the input voltage circuit protects the sampling circuit from the damaging transient voltages, the sampling circuit is fabricated from one or more appropriate types of transistors (lower voltage transistors such as CMOS) facilitating accurate current calculations using a small sized capacitor circuit to store the sample of the input voltage.

Figure 1:
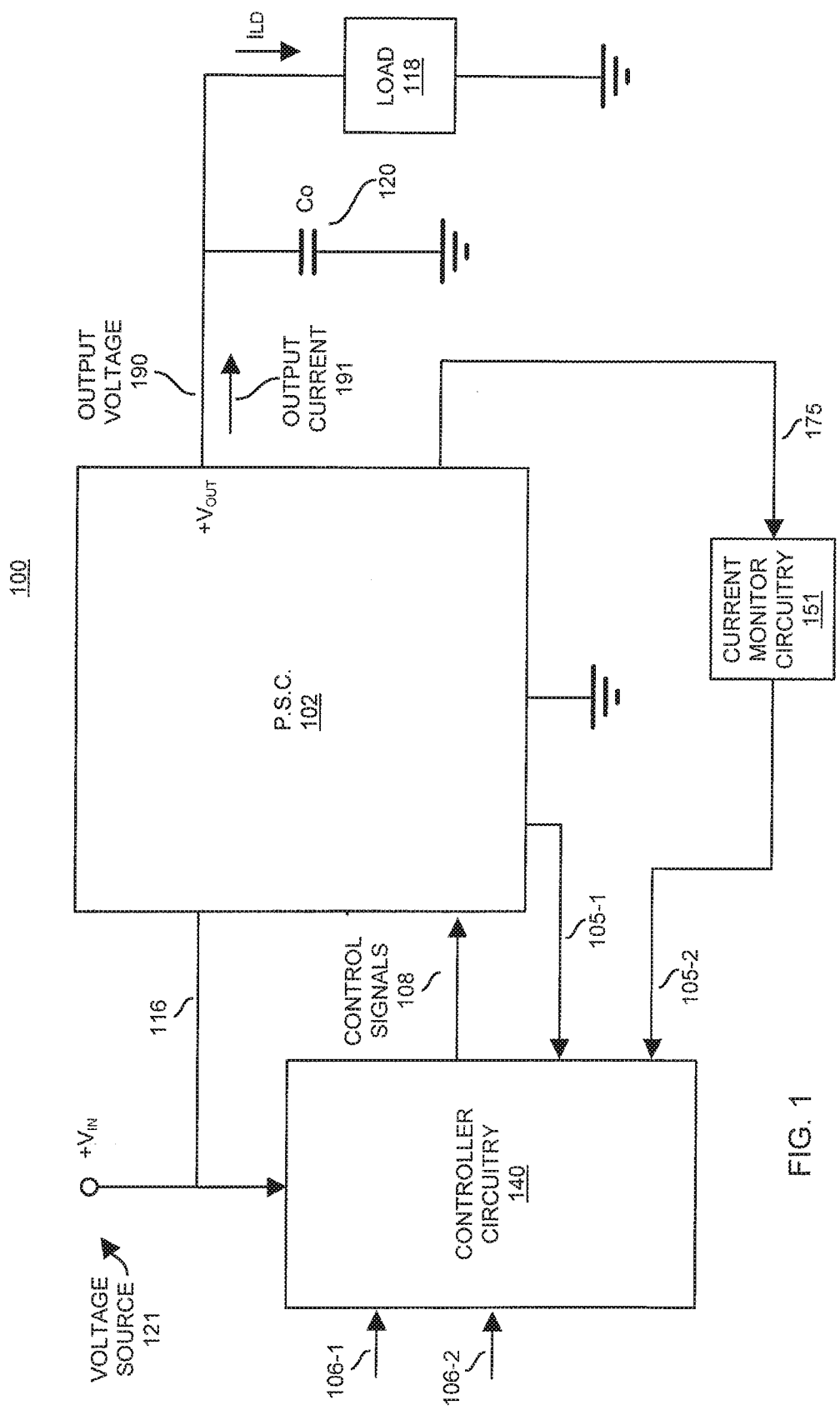
FIG. 1 is an example diagram of a power supply and corresponding current monitor circuitry according to embodiments herein.

Now, more specifically, FIG. 1 is an example diagram of a power supply according to embodiments herein.

As shown, the power supply 100 includes controller circuitry 140. As its name suggests, controller circuitry 140 controls an operation of power supply circuitry 102 and converts the input voltage 116 (received from voltage source 121), VIN, into output voltage 190 based at least in part on one or more switching control functions.

As further shown, output voltage 190 delivers output current 191 ($I_{LD}$) to power load 118.

According to further embodiments, in addition to receiving the input voltage 116 (Vin), controller circuitry 140 receives feedback 105 (feedback 105-1 such as output voltage 190 (Vout), feedback 105-2 such as a magnitude of output current 191, etc.).

The controller circuitry 140 uses one or more feedback signals from feedback 105 to produce control signals 108 that, in turn, control operation of power supply circuitry 102 and generation of the output voltage 190.

In one embodiment, the power supply circuitry 102 is a switching power supply such as a DC/DC buck converter. However, note that the power supply circuitry 102 can be any suitable type of power converter.

As further shown, power supply 100 includes output capacitor circuitry 120 ($C_O$) such as one or more capacitors. Presence of the output capacitor circuitry 120 helps to stabilize the output voltage 190.

In accordance with yet further embodiments, the power supply 100 includes current monitor circuitry 151. Current monitor circuitry 151 receives an input voltage 175 representative of current 191 delivered by the power supply phase 170-1 to load 118. During operation, the current monitor circuitry 151 converts the input voltage 175 into feedback 105-2 representing an amount of current delivered to the load 118.

Control circuitry 140 and/or current monitor circuitry 151 can include analog circuitry, digital circuitry, or a combination of both. Note that the controller circuitry 140 and/or current monitor circuitry 151 can be or include a computer, processor, micro-controller, digital signal processor, etc., configured to carry out and/or support any or all of the method operations disclosed herein. In other words, the controller circuitry 140 and/or current monitor circuitry 151 can be configured to include one or more computerized devices, processors, digital signal processor, etc. to operate as explained herein to carry out different embodiments of the invention.

Note further that embodiments herein can further include one or more software programs, executable code stored on a computer readable media to perform the steps and operations summarized above and disclosed in detail below. For example, one such embodiment comprises a computer program product that has a computer-storage medium (e.g., a non-transitory computer readable medium or media) including computer program logic (e.g., software, firmware, instructions, . . . ) encoded thereon that, when performed in the controller circuitry 140 having a processor and corresponding storage, programs the controller circuitry 140 to digitally perform the operations as disclosed herein. Such arrangements can be implemented as software, code, and/or other data (e.g., data structures) arranged or encoded on a computer readable medium such as an optical medium (e.g., CD-ROM), floppy or hard disk or other a medium such as firmware or microcode in one or more ROM or RAM or PROM chips, an Application Specific Integrated Circuit (ASIC), etc. The software or firmware or other such configurations can be stored in or may be accessible to the controller circuitry 140 and/or current monitor circuitry 151 to cause the controller 140 to perform the techniques explained herein.

Accordingly, in addition to hardware and/or firmware, one embodiment of the present disclosure is directed to a computer program product that includes a non-transitory computer readable medium (e.g., memory, storage repository, optical disk, integrated circuit, etc.).

Figure 2:
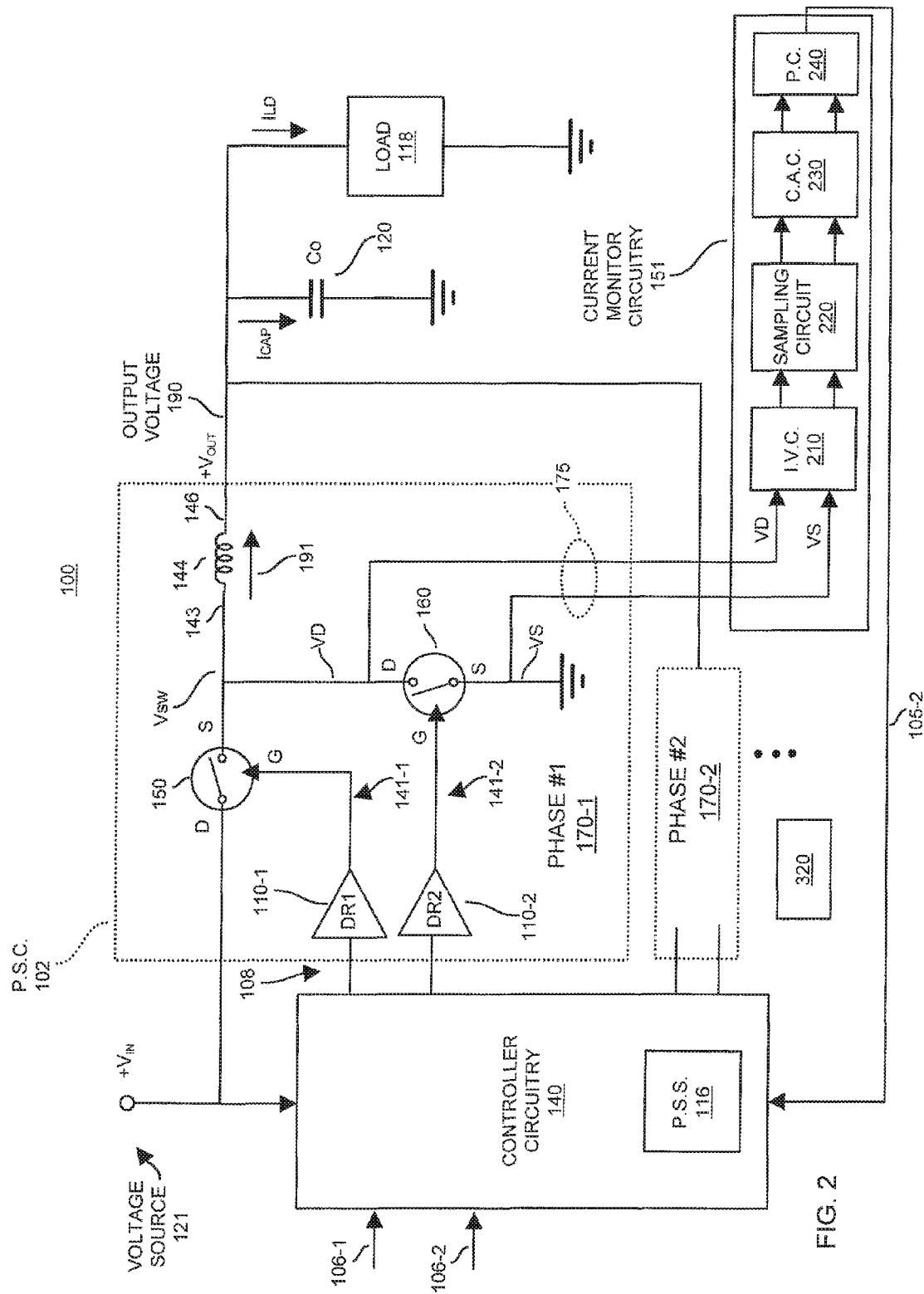
FIG. 2 is an example diagram of current monitor circuitry configured to convert a received input voltage into a corresponding value indicative of an amount of current delivered by a power supply to a load according to embodiments herein.

FIG. 2 is an example diagram of a power supply circuit according to embodiments herein.

As shown, based on the received feedback 105 (i.e., inputs as previously discussed) and configuration settings (power supply settings information 116), controller circuitry 140 produces and outputs control signals 108 to switch the high side switch circuitry 150 and low side switch circuitry 160 to respective ON/OFF states when the phase 170-1 (of multiple phases) is activated.

In one embodiment, the high side switch circuitry 150 includes first field effect transistor circuitry, bipolar junction transistor circuitry, etc.

Low side switch circuitry 160 includes second field effect transistor circuitry, bipolar junction transistor circuitry, etc.

Note that the switch circuitry can be any circuitry that withstands a sufficient amount of current and/or voltage and that may be controlled in order to deliver a desired amount of power to load 118. By way of non-limiting example, the high and low side switch circuitry can include any of one or more vertical or horizontal power switches (coolMos, HexFet), normally OFF (typical FET circuitry), etc.

Switching operation of high side switch circuitry 150 and low side switch circuitry 160 via control signals 108 converts DC input voltage VIN from voltage source 121 into output voltage 190 to power load 118.

In one embodiment, the controller circuitry 140 generates signals controlling the driver circuits 110-1 and 110-2. Based on control signals 108 received from the controller circuitry 140, driver 110-1 controls a state of high side switch circuitry 150 (e.g., control switch circuitry) and driver 110-2 controls a state of low side switch circuitry 160 (e.g., a synchronous switch circuitry) in power supply 100.

Note that driver circuits 110 (e.g., driver circuit 110-1 and driver circuit 110-2) can be located in the controller circuitry 140 or can reside at a remote location with respect to the controller circuitry 140.

When high side switch circuitry 150 is turned ON (i.e., activated) via control signals generated by controller circuitry 140 (while the low side circuitry 160 or synchronous switch is OFF), the current through inductor 144 (i.e., an energy storage element) increases via a highly conductive electrical path provided by high side switch circuitry 150 between voltage source 121 and the input node 143 of inductor 144.

When low side switch circuitry 160 is turned ON (i.e., activated) via control signals generated by controller circuitry 140 (while the high side switch circuitry 150 or control switch is OFF), the current through inductor 144 decreases based on an electrically conductive electrical path provided by the low side switch circuitry 160 between the input node 143 of the inductor 144 and ground as shown. Current flows based upon stored energy in the inductor 144.

Based on proper switching of the high side switch circuitry 150 and the low side switch circuitry 160, the controller 140 regulates the output voltage 190 (at the output node 146 of the inductor 144) within a desired range to power load 118.

In one embodiment, power supply 100 includes multiple phases (phase 170-1, phase 170-2, etc.) as shown.

Each of the multiple phases can be similar to the example phase 170-1 shown in FIG. 1. During heavier load 118 conditions, the controller 140 initiates activation of multiple phases. During lighter load 118 conditions, the controller activates fewer phases such as a single phase 170-1. As previously discussed, the controller 100 activates one or more phases to maintain the output voltage 190 within a desired range to power load 118. If desired, the current monitor circuitry 151 can be replicated to monitor each of the phases.

As shown, each phase can include respective high side switch circuitry and low side switch circuitry as previously discussed. To deactivate a respective phase, the phase controller 140 can set both high side switch circuitry and low side switch circuitry of the respective phase to an OFF state. When off or deactivated, the respective phase does not contribute to producing output voltage 190 to power the load 118.

In accordance with further embodiments, the controller 140 can select how many phases to activate depending on an amount of current consumed by the load 118. For example, when the load 118 consumes a relatively large amount of current, the controller 100 can activate multiple phases to power the load 118. When the load 118 consumes a relatively small amount of current, the controller 140 can activate fewer or a single phase to power the load 118.

The phases can be operated out of phase with respect to each other.

As previously discussed, one embodiment of the power supply 100 includes current monitor circuitry 151. As further shown, current monitor circuitry 151 can be configured to include input voltage circuitry 210 (such as a protection circuit), sampling circuit 220, charge amplifier circuit 230, and processing circuit 240.

During operation, the input voltage circuit 210 (protection circuit) receives an input voltage 175 representative of current 191 delivered by phase 170-1 to load 118. In this example embodiment, the input voltage 175 is a voltage across a drain node and source node of low side switch circuitry 160 (one or more field effect transistors) through which the current 191 is sourced to the load 118. A respective RDSon value of the low side switch circuitry 160 represents a resistance value of the low side switch circuitry 160 through which the current 191 passes.

The input voltage circuit 210 controls conveyance of the received input voltage 175 to sampling circuit 220, protecting the sampling circuit 220 from damage. For example, as will be discussed further in the specification, switch control circuitry 320 initiates activation of switch circuitry in the input voltage circuit 210 during a window of time to provide an electrically conductive path over which to convey the received input voltage 175 to the sampling circuit 220. In one embodiment, the window of time occurs subsequent to and during activation of the low side switch circuitry 160 to a respective ON state.

The sampling circuit 220 utilizes the conveyed input voltage Vds to store a sample voltage representative of the current 191. Further during operation, the charge amplifier circuit 230 amplifies the stored sample voltage. Processing circuit 240 utilizes the RDSon value of the low side switch circuitry and the stored sample voltage to derive a value indicative of the current delivered by the phase 170-1 to the load 118. In one embodiment, the current monitor circuitry 151 forwards the value indicative of the current as feedback 105-2 to the controller circuitry 140.

Figure 3:
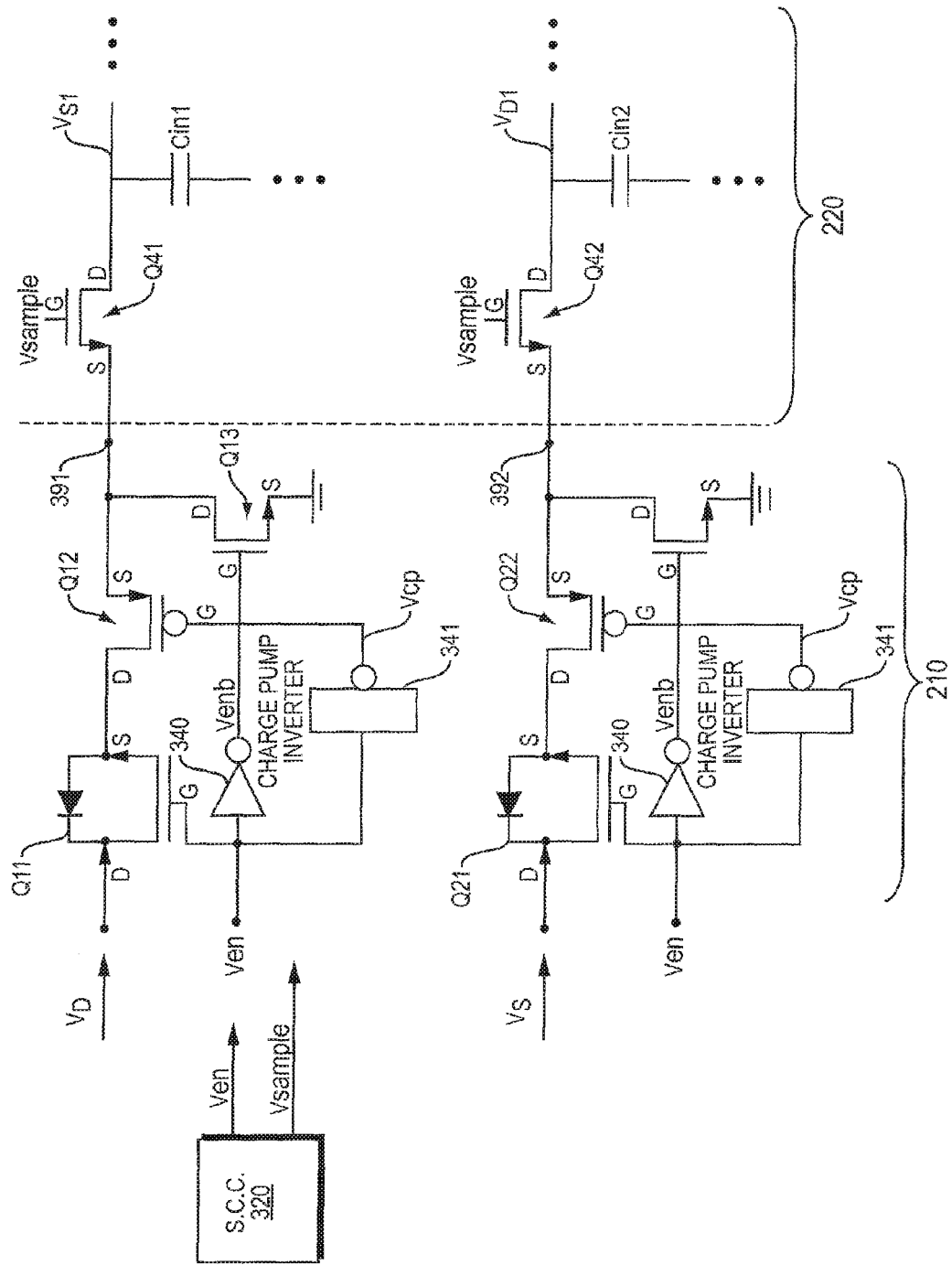
FIG. 3 is an example diagram illustrating an input voltage circuit (a protection circuit) according to embodiments herein.

FIG. 3 is an example diagram illustrating an input voltage circuit (a protection circuit) according to embodiments herein.

As shown, input voltage circuit 210 selectively conveys differential input voltage 175 (voltage Vd and voltage Vs) to the sample circuit 220.

Switch control circuit 320 generates respective control signal, Ven and Vsample to control conveyance of voltage, Vd, through a series connection of switch Q11 and switch Q12 to switch Q41.

In one embodiment, switch Q11 is an HVNLDMOS (High Voltage Laterally Diffused Metal Oxide Semiconductor) type of device; switch Q12 is a PMOS (p-channel MOSFET (metal-oxide-semiconductor field-effect transistor) type of device. Such switches can be any suitable type of devices that withstand transient voltages present on the input voltage 175.

When deactivated to an OFF state, switch Q11 blocks transient voltages greater than a positive threshold value from being passed to switch Q41. When deactivated to an OFF state, switch Q12 blocks transient voltages less than a negative threshold value from being passed to the switch Q41.

Switch control circuit 320 generates respective control signals, Ven and Vsample, to control conveyance of voltage, Vs, through a series connection of switch Q11 and switch Q12 to switch Q41.

In accordance with further embodiments, switch Q21 is an HVNLDMOS (High Voltage Laterally Diffused Metal Oxide Semiconductor) type of device; switch Q22 is a PMOS (p-channel MOSFET (metal-oxide-semiconductor field-effect transistor) type of device. Such switches can be any suitable type of devices that withstand transient voltages present on the input voltage 175 in a manner as previously discussed. For example, when deactivated to an OFF state, switch Q22 blocks transient voltages greater than a positive threshold value from being passed to switch Q42. When deactivated to an OFF state, switch Q22 blocks transient voltages less than a negative threshold value from being passed to the switch Q42.

Figure 4:
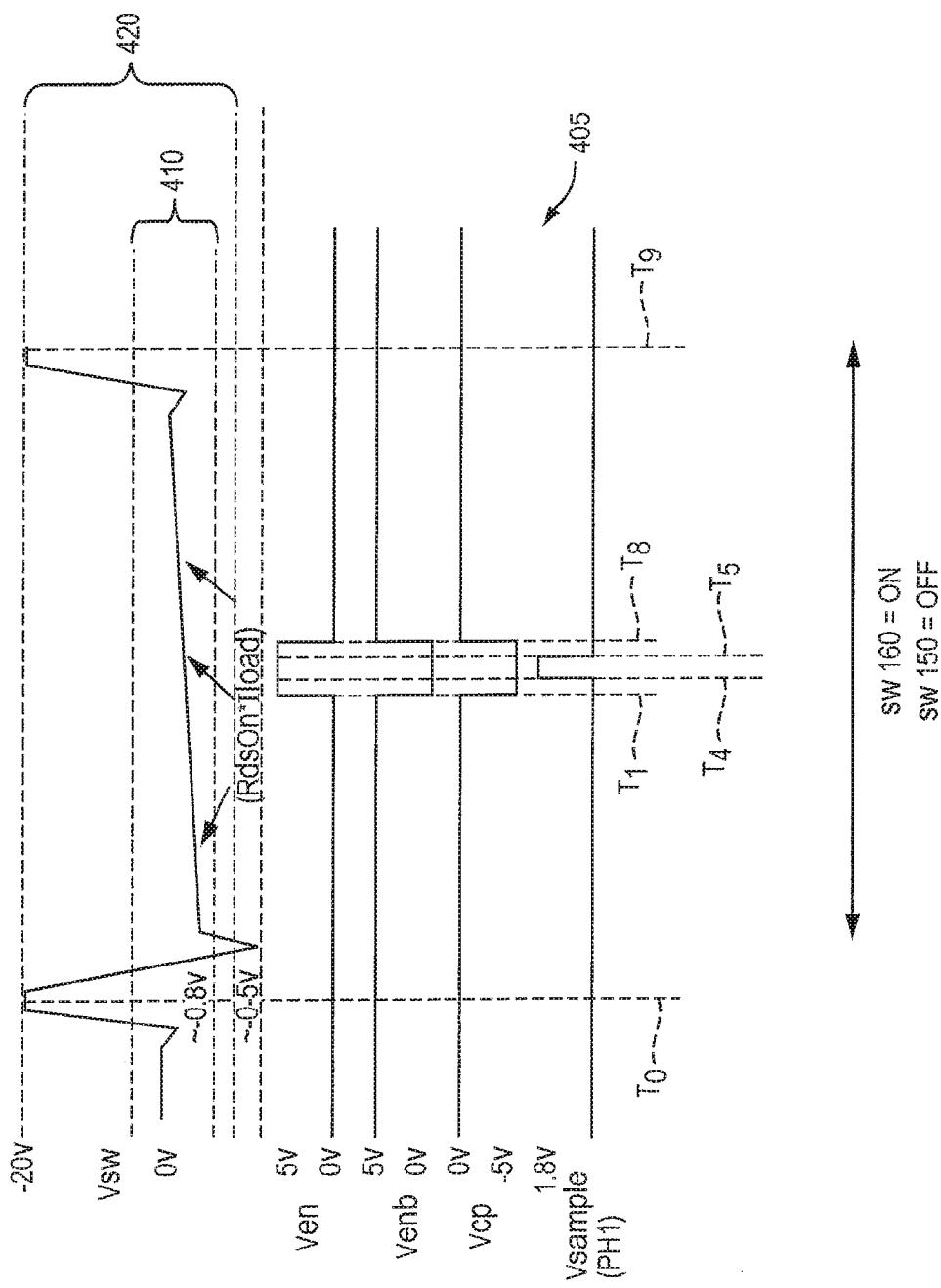
FIG. 4 is an example timing diagram illustrating generation of control signals to control an input voltage circuit according to embodiments herein.

FIG. 4 is an example timing diagram illustrating control of the input voltage circuit according to embodiments herein. The following explanation of circuit operation refers mainly to FIGS. 3 and 4, but may reference other FIGS. as well.

As shown in FIG. 4, switch control circuit 320 generates the control signals shown in timing diagram 405. At approximately time, T0, the controller circuitry 140 deactivates high side switch circuitry 150 and activates respective low side switch circuitry 160. Around such a transition time, the voltage, Vsw, is susceptible to transients that could potentially damage downstream circuitry such as sampling circuit 220, charge amplifier circuitry 230, etc. The transient voltage on input voltage 175 (Vsw, Vd, or Vs) can be as great as indicated by range 420, which would cause damage to the downstream circuitry such as sampling circuit 220, charge amplifier circuit 230, protection circuit 240, etc. In one embodiment, the downstream circuitry is able to withstand exposure to voltages within range 410.

Between approximately time T0 and time T9, the control circuitry 140 activates the low side switch circuitry 160; high side switch circuitry 150 is set to an OFF state. As previously discussed, flow of current through the low side switch circuitry 160 creates a differential voltage (input voltage 175) Vds across the respective drain and source of the low side switch circuitry 160 representative of current 191. As shown in timing diagram 405, transients generally occur at or around time T0, when neither the high side switch circuitry nor the low side switch circuitry is in an ON state.

Between time T0 and time T1, the switch control circuit 320 generates the control signal Ven to be a logic low. This state maintains switches Q11 and Q21 and switches Q12 and Q22 to OFF states, blocking components Vs and Vd of the input voltage 175 from passing to the sampling circuit 220. At such time, the control signal Venb is a logic high, turning switches Q13 and Q23 to ON states. This pulls nodes 391 and 392 to ground using a low impedance path.

At or around time T1, up to time T8, the switch control circuit 320 sets the control signal Ven to a logic high. This causes control signal Venb to be set to a logic low. Setting the control signal Ven to a high state activates both switches Q11 and Q12 as well as switches Q21 and Q22. Thus, between time T1 and time T8, the series combination of switch Q11 and switch Q12 in an ON state provides an electrically conductive path on which to convey voltage Vd to the node 391 of sampling circuit 220. Control signal Venb is set to a logic low state to control switches Q13 and Q23 to OFF states.

Between time window defined by T4 and T5, the switch control circuitry 320 sets control signal Vsample to a logic high state (such as sets the gate of switch Q41 to 1.8 volts). This activates switch Q41, conveying the voltage Vd1 to capacitor circuitry Cin1, charging the capacitor circuitry Cin1 to voltage Vd1. Setting Vsample to a logic high also activates switch Q42, conveying the voltage Vs1 to capacitor circuitry Cin2, charging the capacitor circuitry Cin2 to voltage Vd.

Accordingly, the switch control circuitry 320 is operable to selectively activate the first switches Q11 and Q21 and the second switches Q12 and Q22 during a first window of time (between time T1 and T8) to provide respective electrically conductive paths from the input of the input voltage circuit 210 to the sampling circuit 220. The electrically conductive paths during such a window conveys the input voltage Vds received at the input to the sampling circuit 220. Outside of the window between T1 and T8, the switch control circuitry 320 is operable to selectively deactivate the first switches Q11 and Q21 and the second switches Q21 and Q22 to prevent the received input voltage 175 from being conveyed through the input voltage circuit 210 to the sampling circuit 220.

Sampling of the voltage at node 391 occurs in a smaller window between time T4 and time T5 such as when Vsample is set to a logic high, activating both switches Q41 and Q42 to ON states.

Figure 5:
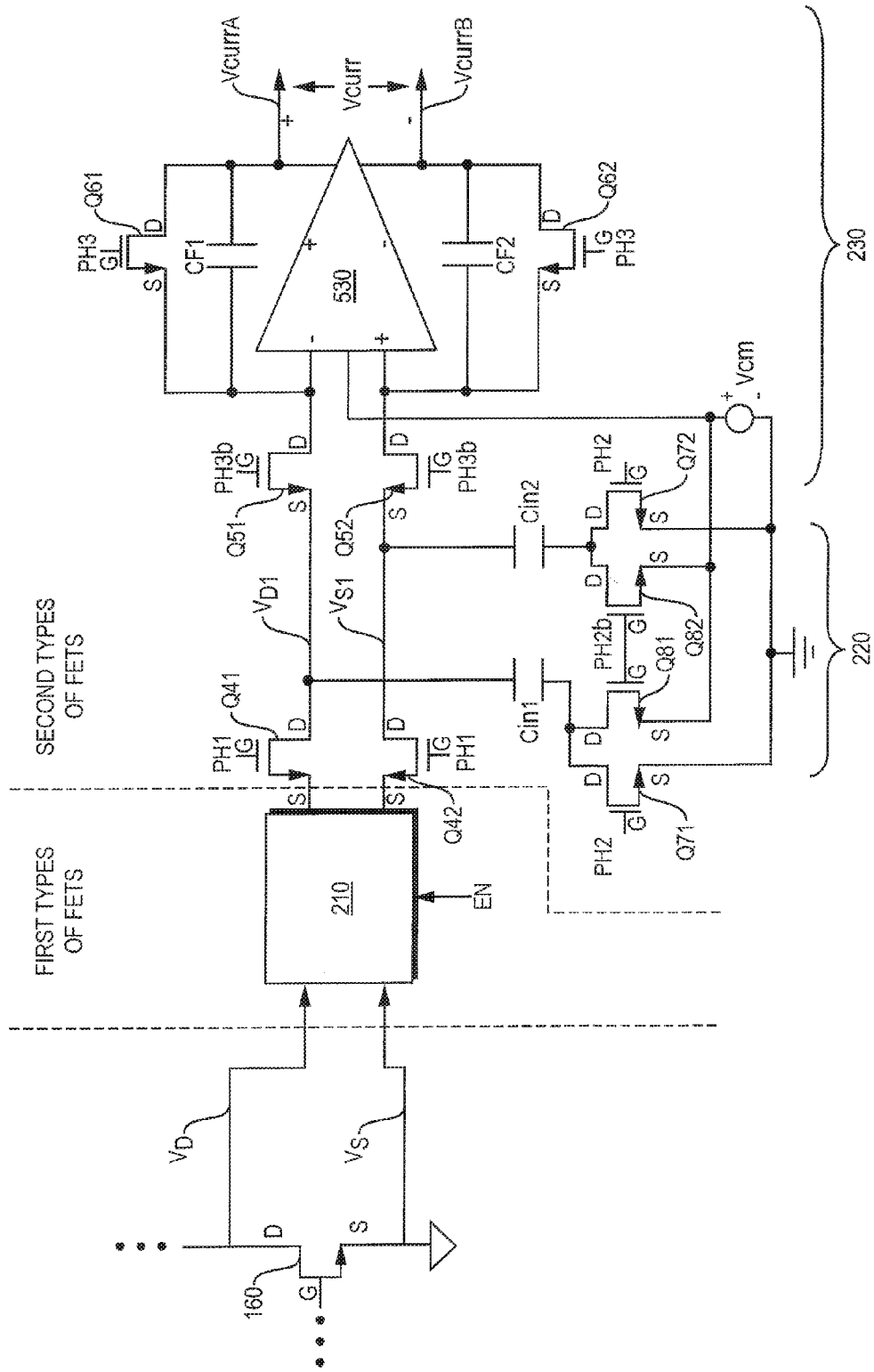
FIG. 5 is a more detailed diagram illustrating a combination of an input voltage circuit, a sampling circuit, and a charge amplifier circuit, etc., according to embodiments herein.
Figure 6:
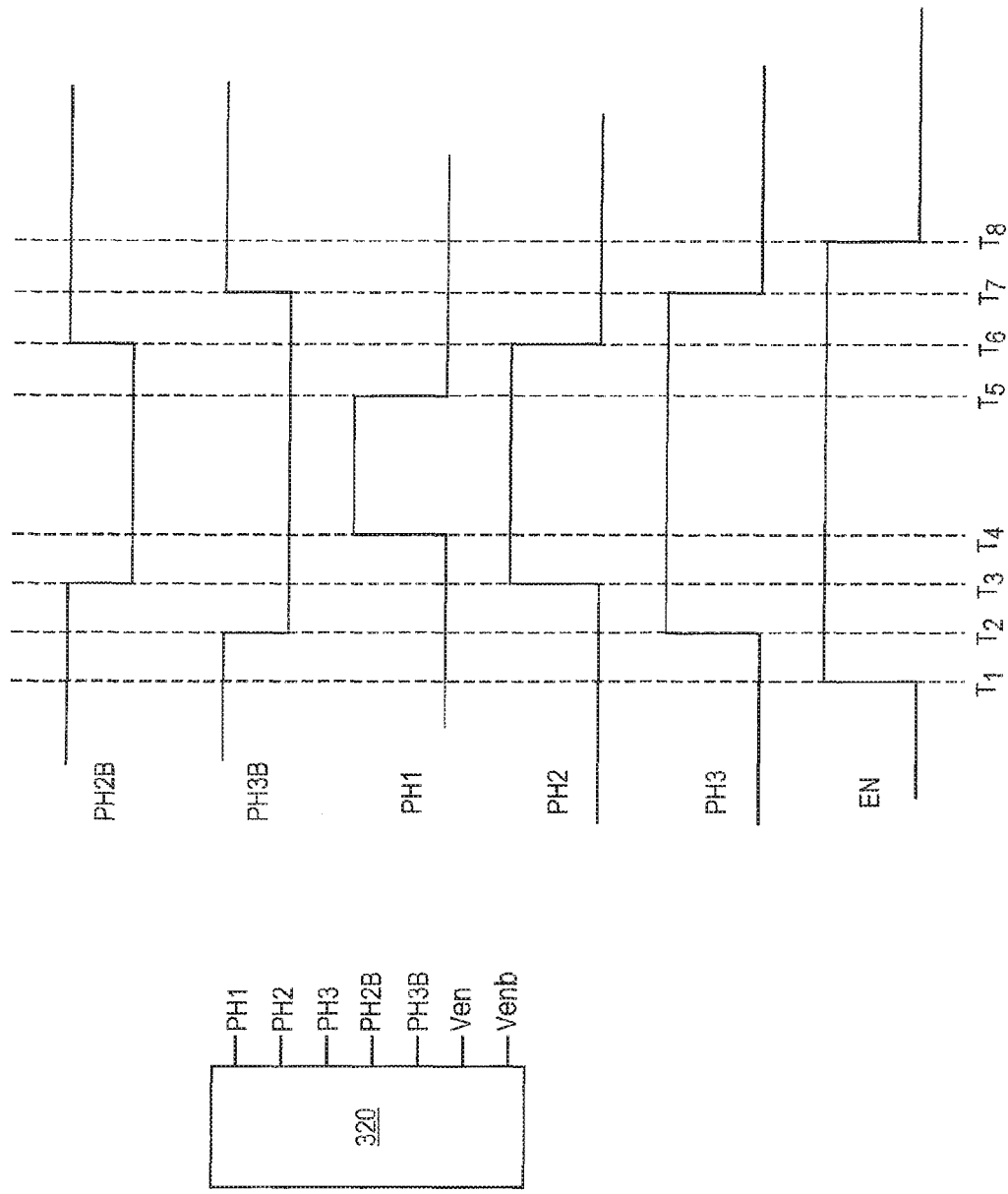
FIG. 6 is an example timing diagram illustrating generation of control signals according to embodiments herein.

FIG. 5 is a more detailed diagram illustrating a combination of an input protection circuit, a sampling circuit, and a charge amplifier circuit according to embodiments herein. FIG. 6 is a diagram illustrating control signals according to embodiments herein.

Referring to FIGS. 5 and 6, in a manner as previously discussed, the switch control circuitry 320 controls switches Q11 and Q12 as well as Q21 and Q21 to ON states in the input voltage circuit 210 during window of time T1 to T8. The switch control circuitry 320 controls sampling switches Q41 and Q42 to ON states in smaller window of time T4 to T5. This latter operation charges the capacitor circuitry Cin1 and Cin2 to respective sample voltages Vd1 and Vs1 in time window T1 to T8.

The switch control circuitry 320 further generates control signal PH2 to control switches Q71 and Q72 to ON states between time T3 and time T6. This sets the bottom plates of capacitors Cin1 and Cin2 to ground. After time T6, the switch control circuitry generates PH2 to deactivate switches Q71 and Q72 to OFF states. At time T6, the switch control circuitry 320 generates control signal PH2b to activate switches Q81 and Q82. This sets the respective bottom plates of capacitors of Cin1 and Cin2 to common mode voltage Vcm, instead of to ground.

Subsequent to storing sample voltage Vd1 on capacitor Cin1 and storing sample voltage Vs1 on capacitor Cin2 in a manner as previously discussed, the switch control circuitry 320 deactivates switches Q41 and Q42 by deactivating the switches Q41 and Q42 at time T5 (control signal PH1 is set low). The switch control circuitry 320 further controls the switches Q51 and Q52 (at or around time T7) to ON states and switches Q61 and Q62 to OFF states (at or around time T7). At such time, after time T7 for the following cycle, the amplifier 530 amplifies voltage Vd1 and voltage Vs1 to respective differential voltages Vcurra and Vcurrb.

Referring again to FIG. 2, after the operational amplifier 530 settles, the processing circuit 240 receives voltage Vcurr (differential voltage between Vcurra and Vcurrb, which is an amplification of differential signal Vd1 −Vs1) from the operational and fire 530 and converts it into a respective current value representative of the current 191 delivered by the phase 170-1 to the load.

Thus, when PH3 is high (PH3*b* is low), the output of the operational amplifier 530 output is fed back to its input and is isolated from the sampling circuit 220. This pre-charges the feedback capacitor CF1 to 0V and sets the outputs and inputs to Vcm. In this manner, the operational amplifier 530 is set in this mode while the input voltage signal is being sampled onto the input capacitors Cin1 and Cin2. Once PH3 goes low (PH3*b* goes high), the Cin (Cin1 and Cin2) capacitor top plates are connected to inputs of the operational amplifier 530. The outputs of the operational amplifier 530 then react to the new differential voltage, Vd1–Vs1. The outputs of the operational amplifier 530 change just enough to maintain a 0V difference at the inputs. With the output starting at Vcm and the bottom plates of Cin being set to voltage, Vcm, if the CF value equals CIN, then the output would have to move an equal but opposite amount that the sampled voltage value on CIN holds. However, in one embodiment, it is desirable to have voltage gain. So given that the charge must be conserved, the change in output voltage (Vcurr) is the ratio of Cin/CF times the sample voltage.

This then allows the charge amplifier circuit 530 (OPAMP) to settle during the entire cycle time other than the small aperture time taken to sample the input voltage Vds during which time the OPAMP is "Offline". This provides a major savings in operational amplifier 530 bias current and thus power and size, since the operational amplifier 530 can be quite a bit slower than if the charge amplifier circuit 530 needed to operate in a very small window of time.

In one embodiment, the processing circuitry 240 utilizes the following formula to calculate current 191 delivered to load 118 as follows:

Magnitude of current 191=Vcurr*(1/RDS$_{ON}$)*(CF1/CIN1),

Where Cin1=Cin2, CF1=CF2.

Note that capacitors Cin1 and Cin2 can be any suitable values. In one embodiment, the presence of input voltage circuit 210 (protection circuit) enables fabrication of the sampling circuit 220, charge amplifier circuit 230, processing circuit 230, etc. using CMOS transistors capable of withstanding voltages of around 2.5 volts.

The capacitors Cin can be fabricated in any suitable manner and can be any suitable size. In one embodiment the capacitors Cin1 and Cin2 and/or capacitors CF1 and CF2 are fabricated as a fringe-style capacitors on a semiconductor die (chip). By way of non-limiting example, each of the capacitors is sized between 200 and 5000 femtofarads. In accordance with further embodiments, the capacitance of each capacitor Cin1 and Cin2 is less than 2000 femtofarads.

In yet further embodiments, the combination of circuitry, although of different types as previously discussed, can be fabricated on a single semiconductor device. Thus, input voltage circuit 210 (protection circuit), sampling circuit 220, charge amplifier circuit 230, and/or processing circuit, etc., can be fabricated on a single semiconductor chip/die.

In one embodiment, the input voltage circuit 210 comprises a first set of one or more different types of switch circuitry that withstands input voltage magnitudes that are greater than a threshold value such as greater than 2 and up to 20 volts. The sampling circuit 220, charge amplifier circuit 230, etc., can be fabricated with second set of one or more different types of switch circuitry that is susceptible to damage by voltage magnitudes greater than the threshold value of around 2 volts. As previously discussed, the input voltage circuit 210 (first set of switch circuitry) prevents conveyance of the input voltage magnitudes greater than a first threshold value in lower than a second threshold to the downstream circuitry such as sampling circuit 220, charge amplifier circuit 230, etc. (such as second switch circuitry).

Figure 7:
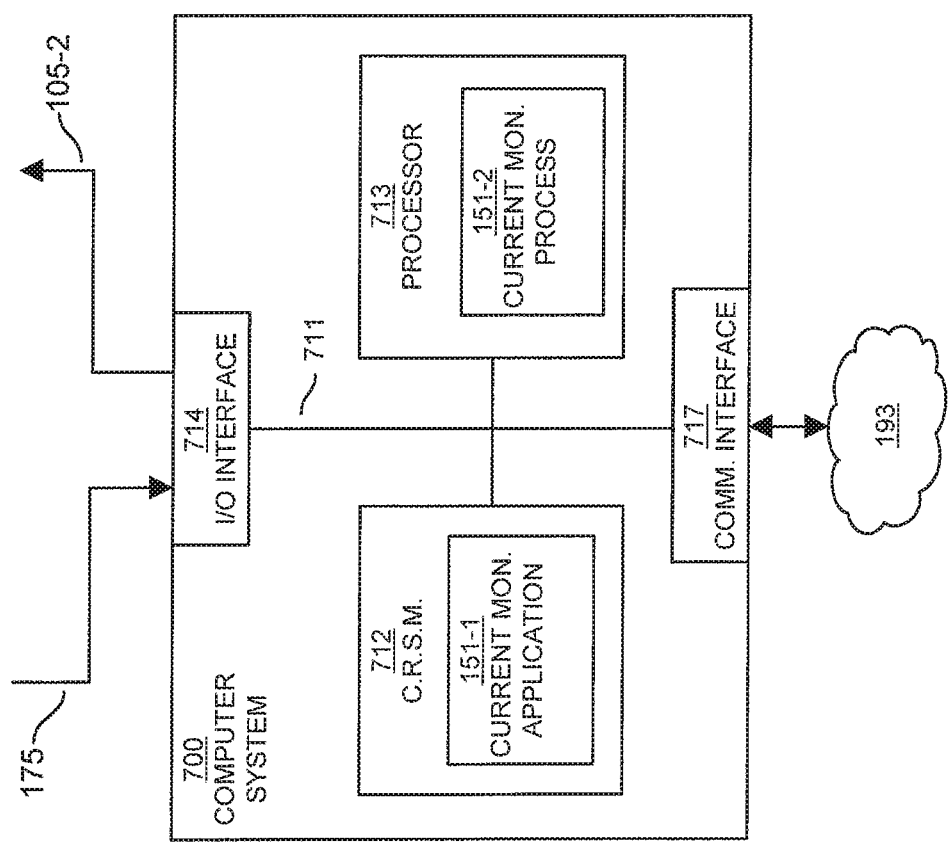
FIG. 7 is an example diagram illustrating computer processor hardware and related software to execute methods according to embodiments herein.

FIG. 7 is an example block diagram of a computer device for implementing any of the operations as discussed herein according to embodiments herein.

As previously discussed, the current monitor circuitry 151 can include computer processor hardware such as computer system 700.

As shown, computer system 700 such as in current monitor circuitry 151 of the present example includes an interconnect 711 that couples computer readable storage media 712 such as a non-transitory type of media (i.e., any type of hardware storage medium) in which digital information can be stored and retrieved, a processor 713 (e.g., computer processor hardware such as one or more processor devices), I/O interface 714, and a communications interface 717.

I/O interface 714 provides connectivity to receive input voltage 175, VIN, etc., as well as to produce feedback 105-2.

Computer readable storage medium 712 can be any hardware storage resource or device such as memory, optical storage, hard drive, floppy disk, etc. In one embodiment, the computer readable storage medium 712 stores instructions and/or data used by the current monitor application 151-1 to calculate the value indicative of current 191 in a manner as previously discussed.

Communications interface 717 enables the computer system 700 and processor 713 to communicate over a resource such as network 193 to retrieve information from remote sources and communicate with other computers.

As shown, computer readable storage media 712 is encoded with current monitor application 151-1 (e.g., software, firmware, etc.) executed by processor 713. Current monitor application 151-1 can be configured to include instructions to implement any of the operations as discussed herein.

During operation of one embodiment, processor 713 accesses computer readable storage media 712 via the use of interconnect 711 in order to launch, run, execute, interpret or otherwise perform the instructions in current monitor application 151-1 stored on computer readable storage medium 712.

Execution of the current monitor application 151-1 produces processing functionality such as current monitor process 151-2 in processor 713. In other words, the current monitor process 151-2 associated with processor 713 represents one or more aspects of executing current monitor application 151-1 within or upon the processor 713 in the computer system 150.

In accordance with different embodiments, note that computer system may be a micro-controller device configured to control a power supply and perform any of the operations as described herein.

Functionality supported by the different resources will now be discussed via flowcharts in FIGS. 8-10. Note that the steps in the flowcharts below can be executed in any suitable order.

Figure 8:
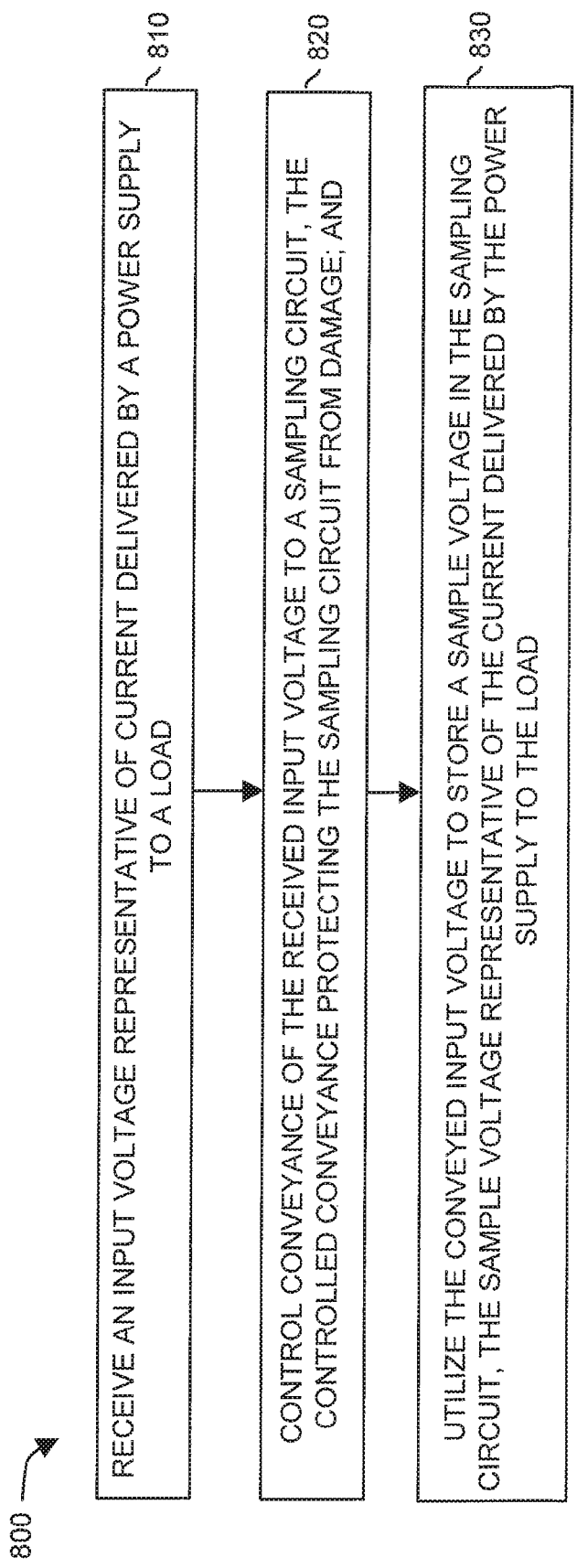
FIGS. 8-10 are example diagrams illustrating methods according to embodiments herein.

FIG. 8 is a flowchart 800 illustrating an example method according to embodiments. Note that there will be some overlap with respect to concepts as discussed above.

In processing operation 810, the input voltage circuit 210 receives input voltage 175 representative of the output current 191 delivered by the power supply 102 to the load 118.

In processing operation 820, the input voltage circuit 210 controls conveyance of the received input voltage 175 to sampling circuit 220. The controlled conveyance of the input voltage 175 protects the sampling circuit 220 from damage.

In processing operation 830, the sampling circuit 220 utilizes the conveyed input voltage from the input voltage circuit 210 to store a sample voltage in the sampling circuit 220. The sample voltage is representative of the current delivered by the power supply 102 to the load 118.

Figure 9:
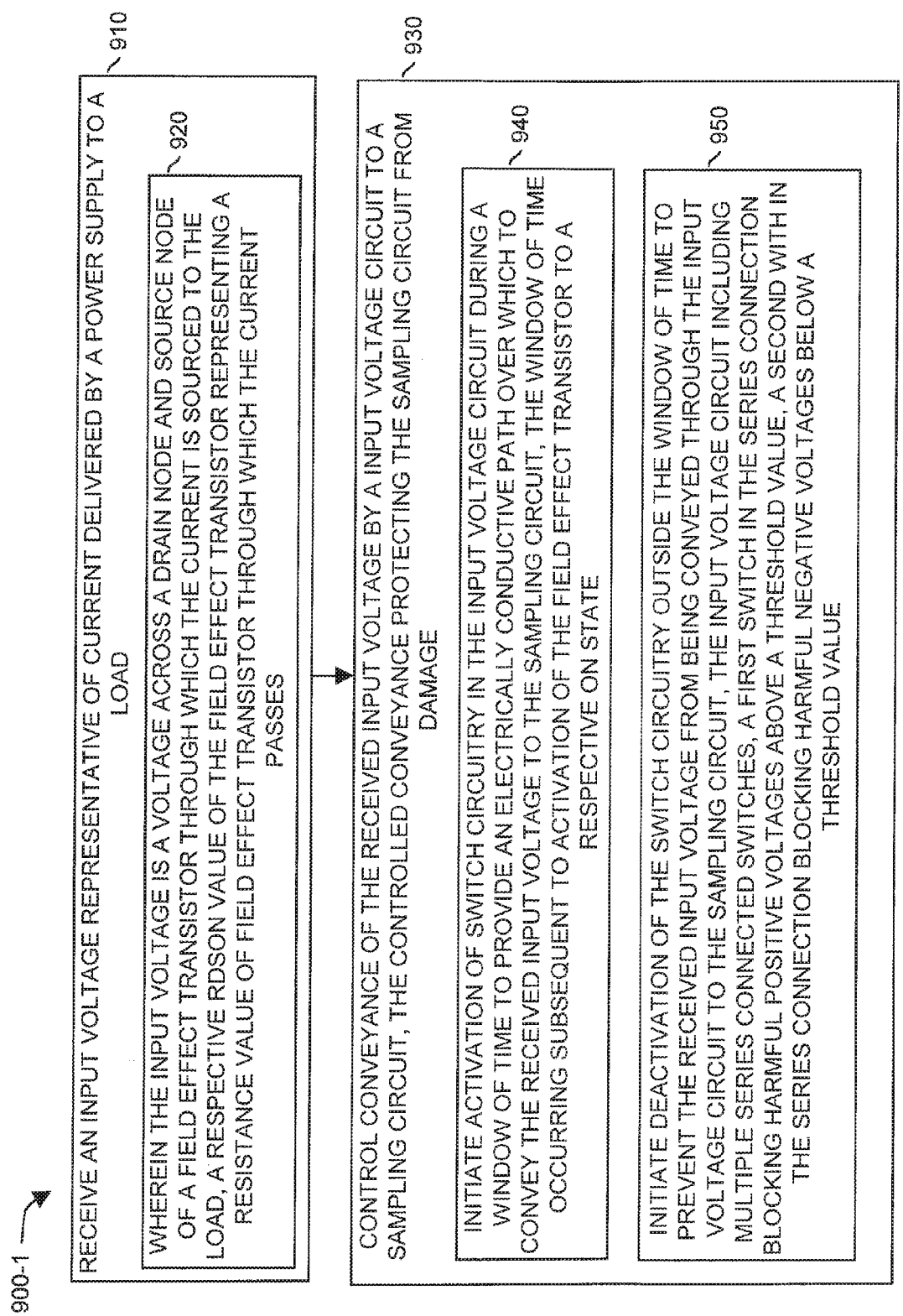
Figure 10:
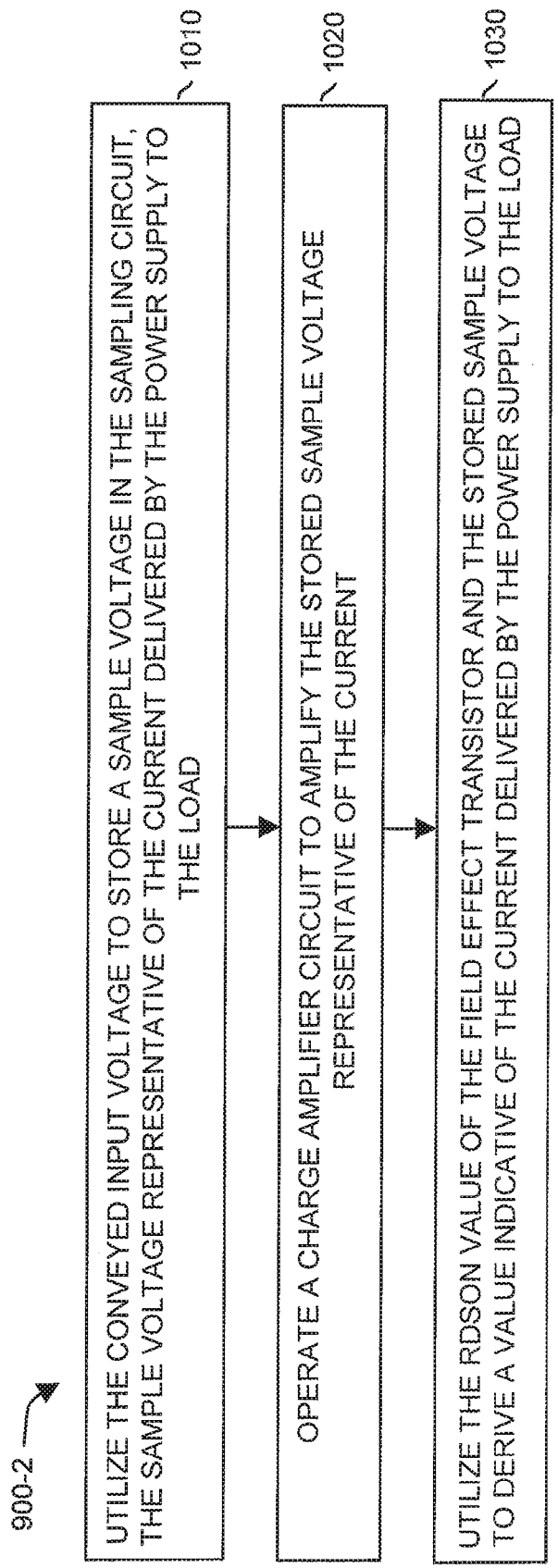

FIGS. 9-10 combined to form a flowchart 900 (flowchart 900-1 and flowchart 900-2) illustrating an example method according to embodiments. Note that there will be some overlap with respect to concepts as discussed above.

In processing operation 910, the input voltage circuit 210 receives an input voltage 175 representative of output current 191 delivered by power supply phase 170-1 to load 118.

In processing operation 920, the input voltage 175 is a voltage across a drain node and source node of switch 160 (such as a field effect transistor) through which the current 191 is sourced to the load 118. A respective $RDS_{ON}$ value of the switch 160 represents a resistance value of the field effect transistor through which the current 191 passes through inductor 144 to load 118.

In processing operation 930, the input voltage circuit 210 controls conveyance of the received input voltage 175 to downstream sampling circuit 220. As previously discussed, the controlled conveyance of the input voltage 175 protects the sampling circuit 220 from damage.

In processing operation 940, the switch control circuit 320 initiates activation of switch protection circuitry (such as switch Q11 and switch Q12 as well as switch Q21 and switch Q22) in the input voltage circuit 210 during a respective window of time to provide an electrically conductive path over which to convey the received input voltage 175 to the sampling circuit 220. In one embodiment, the window of time occurs subsequent to activation of and while the switch circuit 160 is controlled to an ON state.

In processing operation 950, the switch control circuit 320 initiates deactivation of the switch protection circuitry (such as switch Q11 and switch Q12 as well as switch Q21 and switch Q22) outside the window of time to prevent the received input voltage 175 (and corresponding voltage spikes) from being conveyed through the input voltage circuit 210 to the sampling circuit 220. As previously discussed, the input voltage circuit 210 can be configured to include multiple series connected switches. First switches (such as switch Q11 and switch Q21) in respective series connections block harmful positive voltages above a threshold value; second switches (such as switch Q12 and switch to Q22) in respective series connections block harmful negative voltages below a threshold value. Accordingly, the downstream circuitry such as sampling circuit 220 and charge amplifier circuit 230 is not exposed to damaging voltage spikes presence on the input voltage 175.

In processing operation 1010 in FIG. 10 (flowchart 900-2), the sampling circuit 220 utilizes the input voltage 175 conveyed during the window of time to store a sample voltage on respective capacitor circuitry. The sample voltage is representative of the current 191 delivered by the power supply phase 170-1 to the load 118.

In processing operation 1020, in a manner as previously discussed, the charge amplifier circuit 230 amplifies stored sample voltage (VD1 and VS1).

In processing operation 1030, the processing circuit 240 utilizes the $RDS_{ON}$ of the low side switch circuitry 160 and the stored sample voltage (of the input voltage 175 sampled during the window) to derive a feedback 105-2 (a current magnitude value) indicative of an amount of current 191 delivered by the power supply phase 170-1 to the load 118.

Note again that techniques herein are well suited for use in power supply applications and calculation of the output current of a respective phase to a load. However, it should be noted that embodiments herein are not limited to use in such applications and that the techniques discussed herein are well suited for other applications as well.

Based on the description set forth herein, numerous specific details have been set forth to provide a thorough understanding of claimed subject matter. However, it will be understood by those skilled in the art that claimed subject matter may be practiced without these specific details. In other instances, methods, apparatuses, systems, etc., that would be known by one of ordinary skill have not been described in detail so as not to obscure claimed subject matter. Some portions of the detailed description have been presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm as described herein, and generally, is considered to be a self-consistent sequence of operations or similar processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has been convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a computing platform, such as a computer or a similar electronic computing device, that manipulates or transforms data represented as physical electronic or magnetic quantities within memories, registers, or other information storage devices, transmission devices, or display devices of the computing platform.

While this invention has been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the invention are presented in the following claims.

I claim:

1. An apparatus comprising:
   an input, the input operable to receive a voltage representative of current delivered by a power supply to a load;

a protection circuit operable to receive the voltage; and
a sampling circuit coupled to the protection circuit to receive the voltage, the protection circuit controllably conveying the voltage to protect the sampling circuit from damage, the sampling circuit utilizing the voltage conveyed by the protection circuit to store a sample voltage representative of the current.

2. The apparatus as in claim 1, wherein the sampling circuit includes a sampling switch operable to selectively couple the protection circuit to capacitor circuitry in the sampling circuit, activation of the sampling switch electrically coupling the voltage received from the protection circuit to the capacitor circuitry in the sampling circuit.

3. The apparatus as in claim 2, wherein the protection circuit includes multiple switches to controllably convey the voltage to the sampling circuit, the multiple switches including a series connection of a first switch and a second switch through which the voltage is controllably conveyed to the sampling circuit.

4. The apparatus as in claim 3 further comprising:
a first control resource operable to selectively activate the first switch and the second switch during a window of time to provide an electrically conductive path from the input to the sampling circuit, the electrically conductive path conveying the voltage received at the input to the sampling circuit; and
wherein the first control resource is operable to selectively deactivate the first switch and the second switch outside of the window of time to prevent the received voltage from being conveyed through the protection circuit to the sampling circuit.

5. The apparatus as in claim 4 further comprising:
a second control circuit, the second control circuit operable to selectively activate the sampling switch to an ON state during a portion of the window of time in which the electrically conductive path conveys the voltage from the input to the capacitor circuitry of the sampling circuit, the second control circuit operable to selectively deactivate the sampling switch to an OFF state during the window of time.

6. The apparatus as in claim 1, wherein the protection circuit is operable to prevent conveyance of the voltage to the sampling circuit during a first condition in which a magnitude of the voltage is greater than a first threshold value; and
wherein the protection circuit is further operable to prevent conveyance of the voltage to the sampling circuit during a second condition in which a magnitude of the voltage is below a second threshold value.

7. The apparatus as in claim 1 further comprising:
a charge amplifier circuit, the charge amplifier circuit operable to amplify the stored sample voltage representative of the current.

8. The apparatus as in claim 7, wherein the stored sample voltage is a differential voltage, the charge amplifier circuit converting the stored differential voltage into an outputted differential voltage representative of the current delivered by the power supply to the load.

9. The apparatus as in claim 1, wherein the voltage is a differential voltage across a drain node and source node of a field effect transistor through which the current is sourced to the load, an RDSON value of the field effect transistor representing a resistance value of field effect transistor through which the current passes, the apparatus further comprising:
a processing circuit, the processing circuit operable to utilize the $R_{DSON}$ value of the field effect transistor and the stored sample voltage to derive a value indicative of the current delivered by the power supply to the load.

10. The apparatus as in claim 1, wherein the power supply is a switching power supply; and
wherein the voltage is a differential voltage across a synchronous switch of the switching power supply, the protection circuit preventing transient voltages greater than a threshold value from being conveyed to the sampling circuit, the sampling circuit susceptible to damage when exposed to the transient voltages above the threshold value.

11. The apparatus as in claim 1, wherein the protection circuit comprises a first set of switch circuitry that withstand voltage magnitudes that are greater than a threshold value; and
wherein the sampling circuit comprises a second set of switch circuitry that is susceptible to damage by the voltage magnitudes greater than the first threshold value, the first set of switch circuitry controlled to prevent conveyance of the voltage magnitudes greater than the threshold value to the second switch circuitry in the sampling circuit.

12. The apparatus as in claim 1 further comprising:
switch control circuitry operable to simultaneously activate both first switch circuitry in the protection circuit and second switch circuitry in the sampling circuit to convey the voltage on an electrically conductive path to capacitor circuitry in the sampling circuit.

13. The apparatus as in claim 12, wherein the switch control circuitry is operable to simultaneously activate the first switch circuitry and the second switch circuitry during a window in which a magnitude of the voltage is within a voltage range that will not cause damage to the sampling circuit.

14. The apparatus as in claim 1, wherein the sampling circuit includes capacitor circuitry to store the voltage conveyed from the protection circuit; and
wherein the capacitor circuitry is fabricated as fringe style capacitor circuitry.

15. The apparatus as in claim 1, wherein the sampling circuit includes capacitor circuitry to store the sample voltage; and
wherein the capacitor circuitry is fabricated on a semiconductor chip.

16. The apparatus as in claim 1, wherein the protection circuit includes switch circuitry to convey the received voltage to a sampling switch in the sampling circuit during a first window of time, the sampling switch activated in a second window of time to electrically couple the received voltage to capacitor circuitry in the sampling circuit, the apparatus further comprising:
a shunt switch coupled to a node coupling the switch circuitry and the sample switch, the sample switch activated to couple the node to ground outside the window of time when the sampling switch is deactivated.

17. The apparatus as in claim 1, wherein the voltage represents a voltage across a drain node and source node of a field effect transistor through which the current is sourced to the load.

18. The apparatus as in claim 1, wherein the voltage is received from a low side switch in the power supply.

19. The apparatus as in claim 18 further comprising:
switch control circuitry operable to convey the voltage on an electrically conductive path to the sampling circuit when the low side switch is in an ON state.

20. The apparatus as in claim 1 further comprising:
a low side switch circuit operable to produce the voltage inputted to the protection circuit; and
control circuitry operable to use the stored sample voltage representative of the current to control operation of the low side switch circuit.

21. The apparatus as in claim 20, wherein the control circuitry is operable to control the low side switch circuit to convert a received voltage into an output voltage that powers the load.

22. A method comprising:
receiving a voltage representative of current delivered by a power supply to a load;
controlling conveyance of the received voltage to a sampling circuit, the controlled conveyance protecting the sampling circuit from damage; and
utilizing the conveyed voltage to store a sample voltage in the sampling circuit, the sample voltage representative of the current delivered by the power supply to the load.

23. The method as in claim 22, wherein controlling conveyance of the received voltage to the sampling circuit further comprises:
initiating activation of a sampling switch in the sampling circuit to convey the voltage to capacitor circuitry in the sampling circuit, activation of the sampling switch electrically coupling the voltage to the capacitor circuitry in the sampling circuit.

24. The method as in claim 23, wherein controlling conveyance of the received voltage to the sampling circuit further comprises:
controlling activation of multiple switches including a series connection of a first switch and a second switch through which the voltage is controllably conveyed to the capacitor circuitry in the sampling circuit.

25. The method as in claim 22, wherein controlling conveyance of the received voltage to the sampling circuit further comprises:
initiating activation of switch circuitry during a window of time to provide an electrically conductive path over which to convey the received voltage to the sampling circuit; and
initiating deactivation of the switch circuitry outside the window of time to prevent the received input voltage from being conveyed to the sampling circuit.

26. The method as in claim 22, wherein controlling conveyance of the received voltage to the sampling circuit further comprises:
conveying the voltage on an electrically conductive path to the sampling circuit during a first condition in which a magnitude of the voltage is lower than a first threshold value; and
terminating the electrically conductive path to the sampling circuit during a second condition in which the magnitude of the voltage is expected to be greater than the first threshold value.

27. The method as in claim 22 further comprising:
operating a charge amplifier circuit to amplify the stored sample voltage representative of the current.

28. The method as in claim 22, wherein the voltage is a differential voltage across a drain node and source node of a field effect transistor through which the current is sourced to the load, a respective $R_{DSON}$ value of the field effect transistor representing a resistance value of field effect transistor through which the current passes, the method further comprising:
utilizing the $RDS_{ON}$ value of the field effect transistor and the stored sample voltage to derive a value indicative of the current delivered by the power supply to the load.

29. The method as in claim 22, wherein the voltage is a differential voltage across a synchronous switch of the switching power supply; and
wherein controlling conveyance of the received voltage to the sampling circuit includes preventing transient voltages greater than a threshold value from being conveyed to the sample circuit, the sampling circuit susceptible to damage when exposed the transient voltages above the threshold value.

30. The method as in claim 22 further comprising:
operating switch circuitry to convey the voltage to the sampling circuit, the first set of switch circuitry operable to withstand voltage magnitudes that are greater than a threshold value.

31. The method as in claim 22, wherein controlling conveyance of the received voltage to the sampling circuit includes:
simultaneously activating a series connection of a first switch circuit and a second switch circuit to ON states to convey the voltage on an electrically conductive path to capacitor circuitry in the sampling circuit, the first switch circuit operable to block positive transient voltages above a first threshold value from passing to the sampling circuit during an OFF state, the second switch circuit operable to block negative transient voltages below a second threshold value from passing to the sampling circuit during an OFF state.

32. The method as in claim 22, wherein controlling conveyance of the received voltage to the sampling circuit includes:
simultaneously activating first switch circuit and second switch circuit during a window of time in which a magnitude of the voltage is within an operating range of the sampling circuit.

33. The method as in claim 22 further comprising:
activating a sampling switch in the sampling circuit during the window of time, activation of the sampling switch electrically coupling the received voltage to capacitor circuitry in the sampling circuit; and
outside of the window of time, activating a shunt switch connected to a node coupling the switch circuitry and the sample switch, the sample switch activated to couple the node to ground outside the window of time when the sampling switch is deactivated.

34. Computer-readable storage hardware having instructions stored thereon for processing data information, such that the instructions, when carried out by computer processor hardware, cause the computer processor hardware to perform operations of:
receiving a voltage representative of current delivered by a power supply to a load;
controlling conveyance of the received voltage to a sampling circuit, the controlled conveyance protecting the sampling circuit from damage; and
utilizing the conveyed voltage to store a sample voltage in the sampling circuit, the sample voltage representative of the current delivered by the power supply to the load.

35. The computer-readable storage hardware method as in claim 34, wherein controlling conveyance of the received voltage to the sampling circuit further comprises:
initiating activation of switch circuitry during a window of time to provide an electrically conductive path over which to convey the received voltage to the sampling circuit; and initiating deactivation of the switch circuitry outside the window of time to prevent the received voltage from being conveyed through with circuitry to the sampling circuit, the switch circuitry blocking passage of transient voltages outside the window of time from passing to and damaging the sampling circuit.

\* \* \* \* \*